HERMETIC PACKAGES FOR ELECTRONIC COMPONENTS

Filed July 26, 1962 2 Sheets-Sheet 1

INVENTORS
GEORGE B. BROOKOVER,
CARL J. HUDECEK &
JOHN H. OLIVER

E. J. Holler &
W. A. Schaich
ATTORNEYS

HERMETIC PACKAGES FOR ELECTRONIC COMPONENTS

Filed July 26, 1962 2 Sheets-Sheet 2

INVENTORS
GEORGE B. BROOKOVER
CARL J. HUDECEK &
JOHN H. OLIVER

E. J. Holler &
W. A. Schaich
ATTORNEYS

United States Patent Office 3,404,213
Patented Oct. 1, 1968

3,404,213
HERMETIC PACKAGES FOR ELECTRONIC COMPONENTS

George B. Brookover and Carl J. Hudecek, Toledo, and John H. Oliver, Maumee, Ohio, assignors, by mesne assignments, to Owens-Illinois, Inc., a corporation of Ohio Filed July 26, 1962, Ser. No. 212,563
3 Claims. (Cl. 174—52)

This invention relates to hermetic packages for encapsulating miniaturized electronic components such as transistors, microcircuits and molectronic components, and to methods of making such packages.

A major problem in the field of miniaturization of electronic components involves the packaging thereof and, in particular, hermetically sealing the components so as to exclude air or gases, moisture, dust and other deleterious matter from reaching the component while, at the same time, assuring that the component will ultimately perform its intended function.

It is therefore an object of this invention to provide new and improved hermetically sealed packages for electronic components.

Another object of this invention is to provide such a package which includes, as a part thereof, a carrier for the electronic component which, prior to completion of the package, supports the component and permits further work to be done thereon.

Another object of this invention is to provide new and improved methods of fabricating hermetically sealed packages for electronic components.

According to the present invention, a pair of metal cover plates are formed, each having a desired perimetrical design, and these designs are, preferably substantially similar. Preferably, at least one surface of each plate is oxidized, either before forming or after forming, and onto at least one of the oxidized surfaces of each plate is applied a glaze coating, such as a low-melting solder glass compound. The glaze coating on one of the cover plates, however, is partially removed at the center thereof to form a recess or device cavity. Alternatively, the cavity or recess may be formed by forming an endless rib of low-melt solder glass compound on one surface of the plate so that in either case a component recess or cavity is formed on the plate. In the case of the former, a thin layer of the glaze may be left on the oxidizing coating for insulation purposes or, alternatively, the base of the recess or cavity may be cleaned for making an electrical and/or thermal connection to one of the cover members.

According to one embodiment of the invention, conductor leads are spacedly and insulatingly embedded in the solder glass rib so that the inner ends thereof project into the interior of a subsequently formed cavity or recess while the other ends thereof project outwardly from the edges of the metal plates. The leads from an electronic component or device are affixed to the ends of the leads projecting into the cavity by welding, thermal compression bonding, etc. Alternatively, the device to be received in the component recess or cavity has the leads affixed thereto and said leads are embedded in the rib of solder glass compound. As a third alternative, the leads may be affixed to the device and merely rest on the upper edge of the rib so that in a subsequent step the fusion of the glaze coating on an upper cover plate to the lower rib glaze coating effects securement and sealing of the leads.

Furthermore, the leads may be embedded in a glass powder rib which is deposited on the oxidized surface of one of the metal plates and held in a jig so that the bonding of the solder glass rib, resulting from the melting of the powder, to the cover plate member, and the embedding of the conductor leads in the rib, take place simultaneously with the firing or glazing of the solder glass to form a glaze rib on the metal plate. Normally, the process of forming the glaze coating on the metal plates occurs at a temperature considerably higher than the fusion temperature for the solder glaze.

The upper cover plate, preoxidized and preglazed as mentioned above, is placed over the lower cover plate after the placement of the electronic component or device within the cavity and the affixing of the component leads to the conductors embedded in the solder glass compound.

Heat is locally and conductively applied to a perimetrical edge of the upper plate, which, in its preferred form is relatively thinner than the lower plate or has a lower heat conduction in the plane thereof than the lower plate. The lower plate is surrounded by a heat sink so that heat is rapidly carried away from the lower plate. The arrangement is such that the path of best heat transmission or conduction is through the uppr plate in a direction normal to the plane thereof, the glass solder formed on the upper plate and the glass rib formed on the lower plate, and then through the lower plate to the heat sink.

The over-all effect is that while the glass solder is raised to a fusion temperature, the interior of the cavity or package is maintained at a considerably lower temperature so that during the formation of the hermetic seal, the component is not subjected to harmful temperature rises.

Thus, a hermetic package formed according to the process discussed above, comprises a pair of spaced metal plate members having generally corresponding perimetrical designs, the plates being oxidized and glazed on their facing surfaces with a recess formed in the glaze on one of the plates for the reception of an electronic component or device. The leads of the electronic component extend outwardly from the cavity or recess and are insulatingly embedded in the glass solder. The metal plates forming the upper and lower cover members and the sealant joining these members have distinctive heat conduction characteristics. The best heat path between the two plates is in the direction normal to their planes through the intermediate sealant.

Other objects, advantages and features of this invention will become apparent from the following specification and when taken in conjunction with the accompanying drawings wherein:

FIGS. 1*a* and 1*b* are primarily sectional views illustrating hermetically sealed packages formed in accordance with the present invention;

FIGS. 2*a* and 2*b* illustrate one preglazed and preoxidized metal plate in accordance with the invention;

FIGS. 3*a*, 3*b*, and 3*c* illustrate another outside cover plate of the invention with a cavity or component recess formed thereon for the reception of an electronic component or device;

Figure 1A:
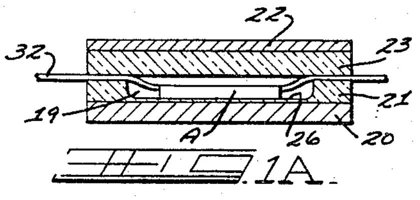
Figure 1B:
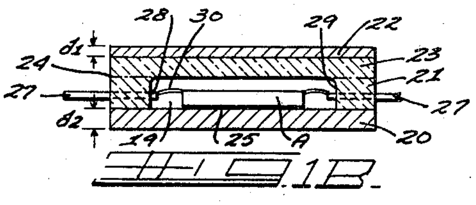
Figure 6:
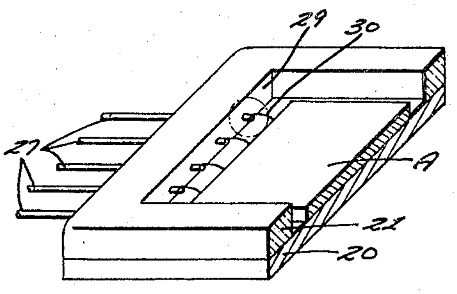
FIG. 6 is a partial view showing a component or device inserted within the cavity with a connection of the leads to the device to the conductors passing through the rib.

With reference to FIGS. 1*a* and 1*b*, a hermetic package according to the invention comprises a lower cover plate 20 having a desired perimetrical design which may be circular or rectangular or any other suitable configuration. A glass solder rib 21 is bonded to the lower cover plate 20 as will appear more fully hereinafter, and said rim is endless so as to form a cavity or recess 19 for receiving an electrical component, device, circuit, etc., designated generally as A. An upper cover plate member 22 which preferably, but not necessarily, has the same perimetrical design as does lower cover plate member 20, has bonded thereto a glass glaze coating 23 which extends over substantially the entire lower or under surface of cover plate 22. It should be pointed out that glass rib 21, which is bonded to the lower cover plate 20 is fused to the glass coating 23 on the upper cover 22 so that the volume of glass between the two metal members 20 and 22 is substantially homogeneous, and that the dotted line 24 showing the point of connection between these two members is merely for reference purposes.

The electrical device A may be electrically and/or thermally bonded to the lower plate member 20 at the area designated by the numeral 25 (see FIG. 1*b*). Alternatively, the upper surface 26 of the lower cover member 20 may have insulating properties (see FIG. 1*a*).

Figure 2A:
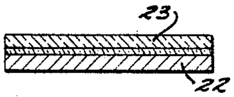
Figure 3A:
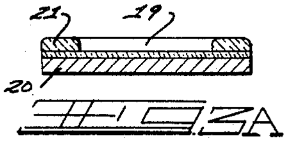
Figure 3B:
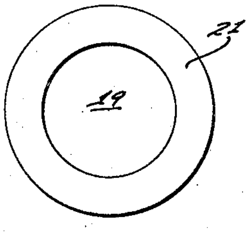
Figure 3C:
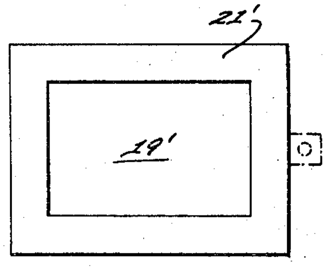
Figure 4:
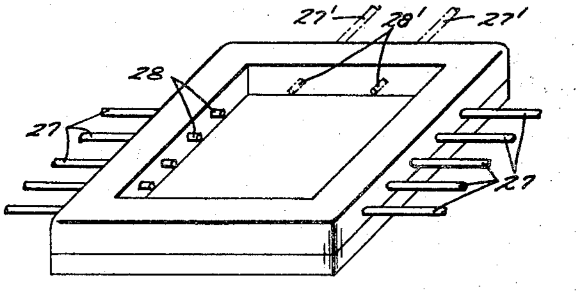
FIG. 4 illustrates a lower plate assembly which may serve as a carrier for the electronic component, the assembly being shown prior to the placing of an electronic component or device into the cavity and the affixing of the leads of the device to the conductors embedded in the rib.
Figure 7:
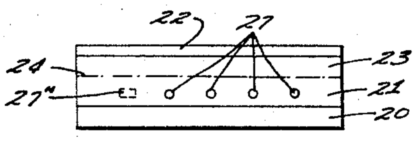
FIG. 7 is an end view of the package shown in FIG. 1*b*.

Extending outwardly from glass rib 21 are a plurality of leads 27 (see FIG. 1*b*) which are insulatingly and spacedly embedded in the glass solder rib 21. Leads 27 may also be flat as shown at 27″ in FIG. 7. The inner ends 28 project only a short distance beyond the inside wall 29 of the glass rib 21 and are adapted to have welded or affixed thereto the leads 30, respectively, of an electrical device A. As shown in the drawings, leads 27 are parallel to each other and extend from opposite sides of rib 21. However, the leads need not extend parallel but may extend from opposite sides or in any direction outwardly from the glass rib 21. For example, as shown in FIG. 4, leads 27′ with their inner ends 28′ extend in directions normal to the directions of leads 27. It is likewise not necessary that the leads be at any specified angle except that they be insulatingly and spacedly held in position by the glass solder rib 21. With reference to FIGS. 3*a* and 3*b*, which disclose a circular perimetrical design for the metal plate as well as the glass rib, the leads (not shown) may extend in any direction radially outwardly from the rib.

Referring now to FIG. 1*a* in which like parts to FIG. 1*b* are designated with like numerals, the electrical component or device A has leads 32 affixed thereto, which leads extend outwardly from the package. However, this arrangement differs slightly from the arrangement shown in FIG. 1*b* in that the conductors extend through the glass at the point of fusion between glass coating 23 on upper cover plate 22 and glass rib 21 on the lower cover plate 20. The particular fabrication process employed in this assembly is described more fully hereinafter. It suffices to note at this point that the bonding and sealing of the glass solder around the leads 32 occurs at the juncture between the glass coating and the glass rib 21 during the forming of the hermetic seal.

It should be noted in connection with each embodiment discussed above, that the upper cover plate member has a lower heat conduction characteristic in a direction lying in the plane thereof than the lower of the cover plate members. Preferably, this is accomplished by forming the upper cover plate member from metal which is relatively thinner than the lower cover plate member. Alternatively, this characteristic may be effected by choosing cover plate members having different heat conductivity characteristics, with the upper cover plate member or the plate to which heat is applied to effect fusion of a glass coating on the upper plate to the glass rib on the other plate having the property of low heat conductivity in a direction lying in the plane thereof. In this connection, it should be noted that the choice of metal for the plate members as well as the glass solder or the glass glaze compound must be such that the bonding of the glaze compound to the metal plate members must be good. In addition, the materials selected for the device must be such that there is no contamination of the electronic device which is contained within the cavity.

Figure 5:
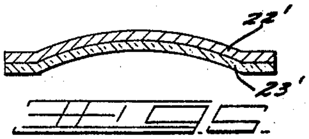
FIG. 5 illustrates a dome shaped upper cover plate.
Figure 2B:
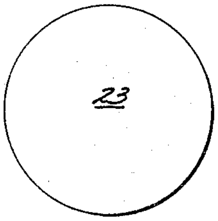

While it is preferred that the cover plate be flat, FIG. 5 discloses a modified cover plate having a dome shaped metal member 22′ and a glass coating 23′. This may be an upper cover member so as to provide a larger space within a package. In order to assure a good sealed joint between the glass and metal members, which is also substantially stress-free, the thermal expansion curves of the metal cover plates and the glass should match as closely as possible. At the same time, the glass should have a melting point somewhat below the temperature required to form the glass to metal bond.

A specific example of a good glass-metal combination is a nickel-iron alloy known as Sylvania No. 4 alloy and a low melt solder glass composition known as Kimble solder glass SG–67 which is a vitreous solder glass having a sealing temperature of about 430° C. The temperature for bonding the solder glass to the metal alloy plate is somewhat higher than this temperature.

*Process of fabricating hermetic packages*

Figures 8, 9, 10, 11:
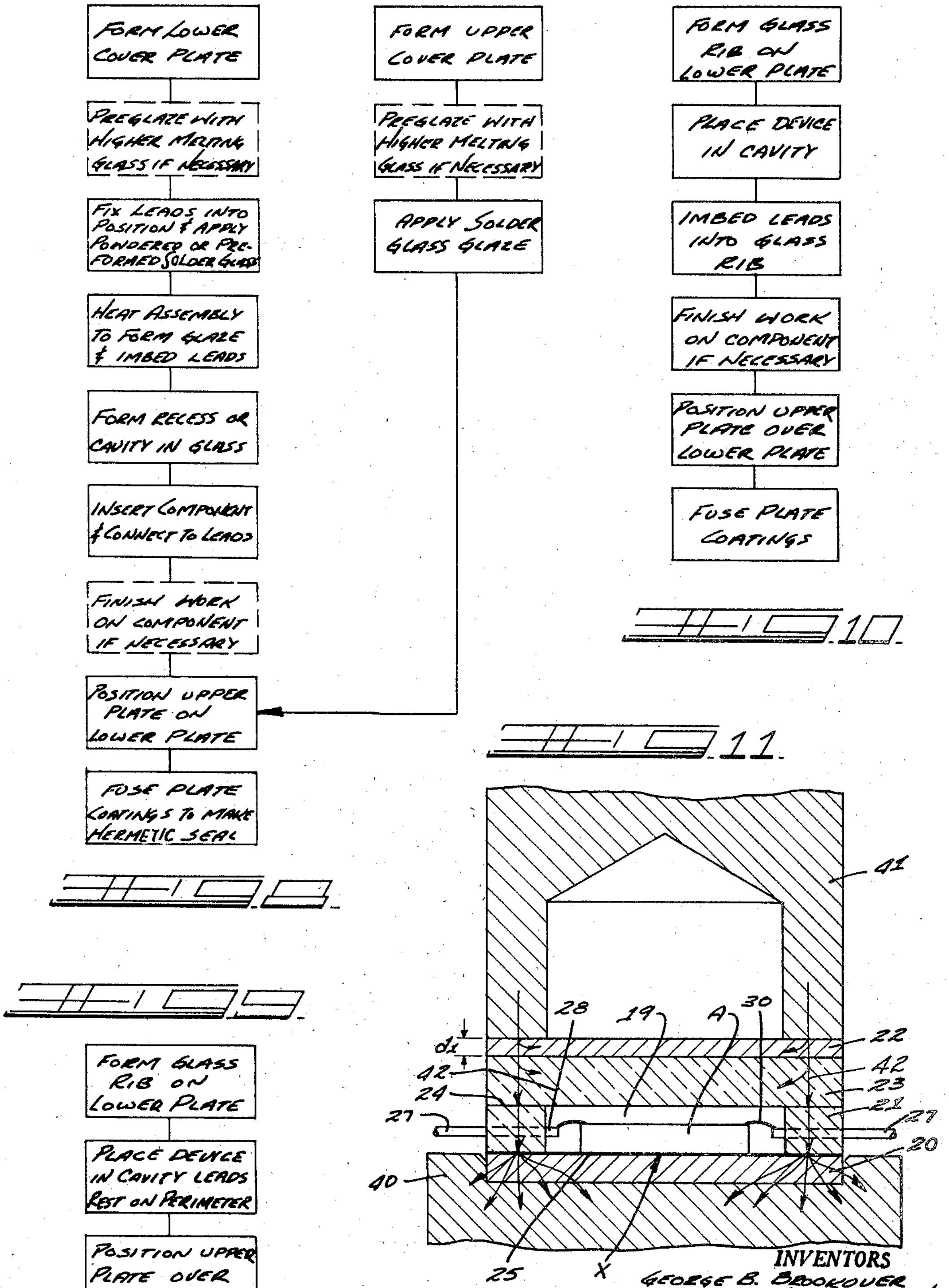
FIGS. 8, 9 and 10 are flow diagrams showing the process of the invention.
FIG. 11 is a diagrammatic illustration of the fusion and joining of the two cover plates to form the hermetic seal.

Referring to the process flow diagram of FIG. 8, the cover plate members are formed by stamping from sheets of metal which have been preoxidized. While not so shown in FIG. 8, the cover plates may be first stamped and then given an oxidizing treatment. The main purpose of the oxidizing treatment is to facilitate the bonding of the solder glass composition to the cover plates. In some specific instances, the oxidizing treatment may form an insulative coating on the plates.

In other cases, the lower and/or upper plates may be preglazed with a glass which has a melting temperature higher than that of the solder glass used to make the final bond. This will provide an insulating layer which separates the leads from the cover plate(s) during fusion of the solder glass while the cover plates are being hermetically sealed together.

The next step after forming, oxidizing, and in some cases, preglazing the lower cover plate, consists of fixing the position of the leads above the lower cover plate and applying powdered or preformed solder glass over the leads and the upper surface of the cover plate. In this step, the glass is in a powdered, preformed, or pelletized condition, and no effort is made to fuse it to the lower cover plate.

The glass powder, preform, or pellet, is fired to form a glaze with the leads 27 embedded therein. The heat source may consist of R.F. heating of the lower cover plate, or subjecting the plate to other known types of heating.

Next, the recess or cavity is formed in the glazed lower cover plate with attached embedded leads. The central portion of the glaze coating on the lower plate member is removed either in part or entirely, either by sandblasting or etching to form a component recess or cavity bounded on all sides by the remaining low-melting solder glass rib.

The initial application of glaze coatings, whether solder glass or other higher melting glass, may be by way of spraying each of the plates with a glass power-alcohol mixture to any desired thickness. It is not particularly necessary that the thickness of the glass powder-alcohol mixture on each of the two plates be the same. Each plate, with the glass powder mixture thereon is then fired in air or in a neutral atmosphere. As noted earlier herein the glass may be a solder glass, or other relatively low-melting glass but should have a good thermal expansion to match the metal being used. A specific example of a good glass-metal combination is Sylvania No. 4 alloy and Kimble solder glass SG–67.

The leads are embedded in the glaze with the outer ends thereof extending beyond the perimetrical edge of the plate while the inner ends project only slightly beyond the inside wall of the rib, as shown, for example, at FIG. 4. The number of leads correspond to the number of leads on the component or device to be positioned within the confines of the rib.

Figure 6A:
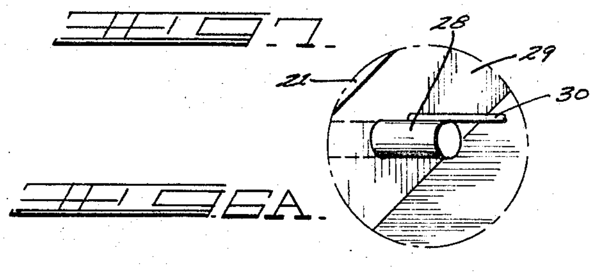
FIG. 6*a* is an enlarged view of a portion of FIG. 6.

The component is inserted or placed within the recess and the leads thereof welded or thermally compressed or otherwise bonded to the inner ends of the conductor leads as shown in the inset FIG. 6*a*. Thus the lower cover plate with the leads 27 extending therefrom forms a carrier for the component or device so that, if necessary, other operations may be performed on the component. This is shown in dotted section on the flow diagram of FIG. 8.

The lower plate member is placed in a heat sink and the upper cover plate with the solder glaze coating thereon is positioned over the lower plate. If the two plates have a common perimetrical design, the plates will, of course, be positioned so that the perimetrical designs are in alignment.

This arrangement and assembly is shown in FIG. 11 of the drawings wherein the assembled package with a component therein is shown as being subjected to the fusion process according to the invention. Lower cover plate member 20 is mounted in a heat sink 40 which may be copper or other material having a high heat conductivity. Additionally, the heat sink 40 may extend slightly upwardly (as shown in the dotted lines of FIG. 11) to engage the outwardly extending leads 27 of the device. A tubular rod 41 which has a perimetrical design corresponding to the perimetrical design of glass rib 21 is brought into direct contact with the upper plate member 22 and in exact positional alignment with the perimetrical design of the glass rib 21. Heating member 41 is heated to red heat to transfer heat therefrom by way of conduction to the upper cover plate member 22.

The path which has the best heat conduction characteristic between the upper cover plate 22 and lower cover plate 20 is designated by the arrows 42. Considering the elements of the package assembly in order, it will be noted that since the thickness $d_1$ of cover plate 22 is relatively thin, heat conduction therethrough is best in a direction normal to the plane thereof while heat conduction in a direction parallel to the plane thereof is considerably reduced. Thus, the heat from heat source 41 is directed into the glass solder coating 23 to the glass rib 21. Inasmuch as the temperature required for bonding the glass coating 23 to metal plate 22 is considerably higher than the fusion temperature of glass coating 23 and glass rib 21, the glass members 21 and 23 melt and fuse together. Heat passes from glass rib 21 through the lower cover plate member 20 and into the heat sink 40.

It should be noted that the coolest point in the assembly is approximately at an area of the component A designated by X. This is particularly advantageous since the component A may be thermally and electrically connected or bonded to the lower cover plate member by a gold-silicon or other low-melting alloy, cement, etc., and, therefore, such bond is not disturbed by the formation of the hermetic seal between the upper and lower cover plate members. The flow diagrams shown in FIGS. 9 and 10 are basically similar to the flow diagram of FIG. 8 insofar as the formation and application of a glaze coating to the upper cover plate is concerned as well as the forming of a lower cover plate. However, the lower cover plate may be glazed over an entire surface and the central interior portion subsequently removed as described in the discussion of FIG. 8. Alternately, only the outer perimetrical edges of the lower cover plate are coated with a vitreous glazing compound and then fired to a temperature to form a glaze and effect bonding of the glaze to the plate. This forms a perimetrical solder glass rib which at this point does not contain leads.

The alternative methods of assembling the package using the perimetrically ribbed lower cover plate are shown in FIGS. 9 and 10. In FIG. 9 the device or component to be encapsulated is placed within the cavity with its leads resting on the formed solder glass rib. The upper cover plate is positioned in juxtaposed relation and sealed by the steps described in the discussion of FIG. 8. Thus, one embodiment of the process is the package illustrated in FIG. 1*a*.

In the alternate process indicated by FIG. 10, the leads of the device to be encapsulated are embedded in the solder glass rib prior to hermetically joining the rib and the upper cover plate. Sealing of the leads within the rib is accomplished by heating in air or in a neutral atmosphere. The upper portion of the device is exposed to allow additional work to be done on the electronic device as desired or required. When the upper cover plate is positioned in alignment with the lower plate and fused thereto, the seal is formed by joinder of glass to glass as shown in FIG. 1*b*.

In connection with each of the processes discussed above, the final step of fusing the upper plate coating to the lower plate coating to form the actual hermetic seal, may take place in a neutral or inert atmosphere, depending upon the characteristics of the device being encapsulated.

In addition, in connection with the processes disclosed in FIGS. 8 and 9, it should be noted (see FIG. 6*a*) that the inner ends 28 of leads 27 are considerably larger in diameter than the leads 30 to the device A shown in FIG. 1*b*, for example, so that heat conduction along these conductors is relatively low and the chances of excessive heating of the electronic device A are minimized. In addition, in the preferred construction, the upper plate is thin so that heat transfer in the plane thereof is slow and rather low due to the reduced cross-sectional area, and heat transfer in a direction normal thereto is relatively high and rapid. Since the lower plate is relatively thicker than the upper plate, heat transfer in the plane thereof is faster, and since there is a heat sink around the lower plate, heat is conveyed away from the lower plate at a very fast rate. Therefore, the interior of the container is maintained at a considerably lower temperature than the fusion temperature of the upper glaze coating to the lower glaze coating. In part, this lower temperature in the interior of the container, is due to the fact that the upper plate is conductively heated locally by the annular heating tube shown in FIG. 11.

Moreover, the change in state of glass coating (from a solid to a liquid) does not occur at as high a temperature as the temperature for bonding the glass coating to the metal plate.

It is significant to note that the hermetically sealed packages formed according to the invention are substantially flat for facilitating the handling thereof and that while the conductor leads 27 may be in a common plane, they are not necessarily parallel to each other and may extend outwardly from any part of the seal. For ease of fabrication, however, the leads which extend from a common edge are preferably parallel.

The glass edge of the package may be smoothed by heating with a small flame while the package is held between two heat sinks.

It will be apparent that the packages and processes discussed hereinabove provide a hermetic glass to metal seal for electronic components, and in particular miniaturize components wherein the glass to metal seal is formed at temperatures in the neighborhood of 900–1200 degrees Fahrenheit, while the interior of the package remains at a temperature of below 550 degrees Fahrenheit. The package may have a total volume below .001 cubic inch.

The carrier shown in FIGS. 4 and 5 consists of a lower disc assembly with embedded leads forming a sub-combination of the instant invention, after welding or affixing the component leads to the ends 28 of leads 27, allows work to be done on the component until just prior to fusion and assembly of the upper cover plate to the lower cover plate.

It is also possible to obtain high chemical durability to various compounds by dipping or painting the entire assembly with epoxies, paints or resins.

Inasmuch as the outer walls of the package are metal, a good thermal and/or electrical connection may be made to one or both walls so that electrical components with relatively considerable power capacity may be encapsulated. It should also be noted that the preglazing of the plates with solder glass prior to sealing enables the final seal to be of a glass to glass variety which is at a substantially lower temperature than the glass to metal variety seal.

Furthermore, by embedding the leads 27 in the glass rib prior to the affixing to the inner ends thereof of the leads to the electronic component or device to be encapsulated, the seal between conductor leads and the glass outer rib may be effected at a temperature high enough to bond the outer surfaces of the conductor leads and the glass with the ultimate end result, as mentioned above, that the final seal is a glass to glass variety (the glass rib to the glass coating on the upper cover plate) which may be effected at a considerably lower temperature than can a glass to metal seal.

Annular packages have been formed in accordance with the invention having a diameter of .218 inch and a total thickness dimension, including the two metal plates and the glass solder rib, less than .025 inch, giving a total volume of less than .0094 cubic inch. Rectangular packages made in accordance with the invention have volumetric limits substantially similar to those just discussed in connection with annular or circular capsules. While the invention is particularly well adapted for miniaturized and microminiaturized electrical components devices and circuits, etc., it is to be understood that the invention is not intended to be so limited.

Moreover, it is to be further understood that the representations in the drawings, particularly as to relative thicknesses of the materials employed are not to scale and are, in fact, greatly enlarged over what those dimensions would be in microelectronic component devices.

It is to be understood that the above-described techniques and arrangements are illustratory of the application of the principles of the invention. Numerous modifications of the methods of the invention as well as the resulting hermetic package formed thereby may be devised by those skilled in the art without departing from the spirit and scope of the invention.

We claim:

1. A hermetic enclosure for an electronic component having extended lead wires, said enclosure consisting of a pair of metal plates, said metal plates having a common perimetrical design, one of said metal plates being thicker than the other of said metal plates, an endless solder glass rib joining said metal plates in spaced apart relation and defining a hermetically sealed recess in which said electrical component is received, an electrical component having extended wire leads, said component being in said recess and on the thicker of said metal plates, said glass solder rib insulatingly separating, holding and surrounding each of the wire leads of said electronic component and spacedly joining said metal plates together, said solder glass rib having thermal expansion characteristics matching the thermal expansion characteristics of said metal plates.

2. A hermetic enclosure as defined in claim 1 including a layer of electrical insulating material on the thinner of said metal plates.

3. A hermetically enclosed electronic device comprising: a thin metallic base member; an electronic device joined to a portion of a surface of said base member, a low melt solder glass member having thermal expansion characteristics matching the thermal expansion characteristics of said thin metallic base member, joined to said surface and defining an endless solder glass wall enclosing said portion of said surface of said thin metallic base member to which said electronic device is joined; said glass member extending from said surface beyond said electronic device, a plurality of electrically conductive leads hermetically sealed within and totally enclosed for a longitudinal increment of said leads by said low melt solder glass member, said leads extending beyond the periphery of said thin metallic base member and being substantially parallel with said surface of said thin metallic base member, said electrical leads being connected to said electronic device; means joined to said low melt solder glass member at a position beyond said electronic device with respect to said thin metallic base member to form a hermetic enclosure with said low melt solder glass member and said thin metallic base member; said means joined to said low melt solder glass member at a position beyond said electronic device with respect to said thin metallic base member consisting of a metallic cover member which is thinner than said thin metallic base member and having thermal expansion characteristics matching the thermal expansion characteristics of said low melt solder glass member; each of said electrical leads being enclosed by the material of said low melt solder glass member to provide electrical independence of each lead from said thin metallic base member and said means joined to said low melt solder glass member.

References Cited

UNITED STATES PATENTS

| | | | |
|---|---|---|---|
| 3,187,240 | 6/1965 | Clark | 174—50 |
| 3,208,892 | 9/1965 | Miller et al. | 174—50 |
| 2,994,121 | 8/1961 | Shockley. | |
| 3,141,999 | 7/1964 | Schneider. | |
| 3,171,187 | 3/1965 | Ikeda et al. | |
| 2,177,502 | 10/1939 | Stack | 174—65 |
| 3,001,113 | 9/1961 | Mueller | 317—234 |
| 2,211,659 | 8/1940 | Johanson | 174—52 |
| 3,070,648 | 12/1962 | Hennessey | 174—52 |
| 2,483,940 | 10/1949 | Scott | 65—59 |
| 2,486,101 | 10/1949 | Beggs | 65—59 |
| 2,985,806 | 5/1961 | McMahon et al. | 174—52 |
| 2,999,964 | 9/1961 | Glickman | 174—52 |

FOREIGN PATENTS

| | | |
|---|---|---|
| 905,650 | 3/1954 | Germany. |

DARRELL L. CLAY, *Primary Examiner.*